Figure 1:
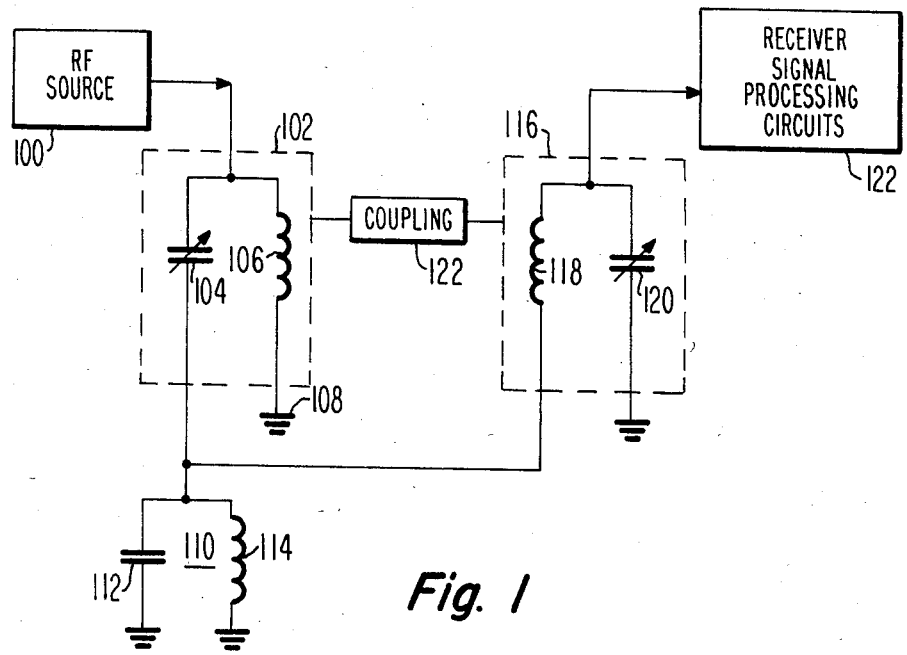

United States Patent [19]

Hettiger

[11] Patent Number: 4,601,062
[45] Date of Patent: Jul. 15, 1986

[54] TRACKING IMAGE FREQUENCY TRAP

[75] Inventor: James Hettiger, Marion County, Ind.

[73] Assignee: RCA Corporation, Princeton, N.J.

[21] Appl. No.: 705,496

[22] Filed: Feb. 28, 1985

[51] Int. Cl.⁴ .......................... H04B 1/10; H04B 15/00
[52] U.S. Cl. .................................... 455/285; 455/286;
    455/306; 455/307; 455/340; 455/302; 333/176
[58] Field of Search ........................... 455/284–286,
    455/291, 302, 305–307, 317, 338–340; 333/175,
    176, 179; 358/167

[56] References Cited

U.S. PATENT DOCUMENTS

| 2,075,683 | 3/1937 | Wheeler | 455/285 |
| 2,250,277 | 7/1941 | Schaper | 333/179 |
| 2,449,148 | 9/1948 | Sands | 455/285 |
| 3,487,339 | 12/1969 | Griepentrog | 455/307 |
| 3,519,737 | 7/1970 | Marsh, Jr. | 333/176 |

OTHER PUBLICATIONS

"Radio Receiver Design", by K. R. Sturley, published by Chapman & Hall, Ltd., London; 1953, pp. 349–353 Discloses Image Suppression Circuits by Neutralizing Feedback Voltage.
"Radio Engineers' Handbook", by F. E. Terman, published by McGraw-Hill Book Company, Inc., New York; 1943, p. 645.

Primary Examiner—Jin F. Ng
Attorney, Agent, or Firm—Paul J. Rasmussen; Peter M. Emanuel; Adel A. Ahmed

[57] ABSTRACT

In a superheterodyne receiver, such as a typical television receiver, a radio frequency coupling arrangement includes a first resonant circuit coupled to receive the input signal and further coupled to a second resonant circuit by a first coupling. Both resonant circuits are tuned to the desired signal frequency. The capacitive branch of the first resonant circuit includes a circuit impedance for providing a neutralizing voltage, at least a portion of which is coupled by a second coupling to the inductive branch of the second resonant circuit. The circuit impedance is selected to cause cancellation in the inductive branch between image frequency components coupled by the first coupling and image frequency components coupled by the second coupling, without substantially affecting the desired signals.

21 Claims, 2 Drawing Figures

TRACKING IMAGE FREQUENCY TRAP

The present invention relates to the field of frequency selective networks and more particularly to networks for discriminating against image response in a superheterodyne receiver, such as a typical television receiver.

In superheterodyne receivers, there is a possibility of obtaining a variety of spurious responses. Image frequency signals are a principal source of spurious responses. Image signals are signals having a frequency that is greater than the frequency to which the receiver is tuned by twice the intermediate frequency (IF), assuming the local oscillator operates at a higher frequency that of the desired signal. If such signals reach the mixer, they combine with the local oscillator signal to produce a difference frequency signal that has a frequency exactly equal to the IF, and so appear in the IF output along with the desired signal. Interference by image frequency signals is particularly undesirable in a television receiver, since interference with the displayed image is readily perceived and is generally annoying to the viewer.

Image responses can be reduced by providing sufficient selectivity between the receiver input and the mixer source to prevent a signal of image frequency from reaching the mixer with appreciable amplitude. Special coupling circuits have been used in radio receivers for improving discrimination against image signals without significantly attenuating the desired signal. Such coupling circuits should also provide tracking of the image suppression or trap frequency with tuning variation such that the frequency separation between the desired frequency and the trap frequency remains constant. This requirement results from the fact that the image frequency separation from the desired signal frequency is independent of tuning, being equal to twice the IF. Examples of such coupling circuits are described in "Radio Receiver Design" by K. R. Sturley, published by Chapman & Hall, Ltd., London; 1953, pp 349-353, and in "Radio Engineers' Handbook" by F. E. Terman, published by McGraw-Hill Book Company, Inc., New York; 1943, p. 645. In these circuits, a neutralizing voltage is developed in an auxiliary coil coupled to the input. The circuit characteristics are selected so that the neutralizing voltage provides cancellation of image frequency signals but does not appreciably affect the desired signal. However, the auxiliary coil in these examples is inductively coupled to other coils in the coupling circuit. While such arrangements using inductive coupling may be satisfactory at relatively low radio frequencies, their implementation poses problems at higher television frequencies, particularly at ultra high frequencies (UHF). At such frequencies, the inductances may consist merely of a short strip of copper foil and under such conditions, the problems of obtaining and adjusting inductive coupling are very difficult and are undesirable, particularly in mass production.

In accordance with an aspect of the invention a first parallel resonant circuit is coupled to receive the input signal to the receiver and is further mutually coupled to a second parallel resonant circuit by a first coupling. A circuit impedance is coupled in the capacitive branch of the first resonant circuit for providing a neutralizing signal. At least a portion of the neutralizing signal is coupled into the inductive branch of the second resonant circuit by a second coupling.

In accordance with another aspect of the invention, both resonant circuits are tuned to the desired signal frequency.

In accordance with a further aspect of the invention, the circuit impedance is selected to exhibit a frequency characteristic such that substantial cancellation occurs in the inductive branch of the second resonant circuit between image frequency signal components coupled by way of the first coupling and image frequency components coupled by way of the second coupling. In accordance with yet another aspect of the invention, cancellation of corresponding desired signal frequency components is substantially less than the cancellation between image frequency components. In accordance with still another aspect of the invention, the frequency separation between the desired signal and image frequencies is substantially constant.

Figure 2:
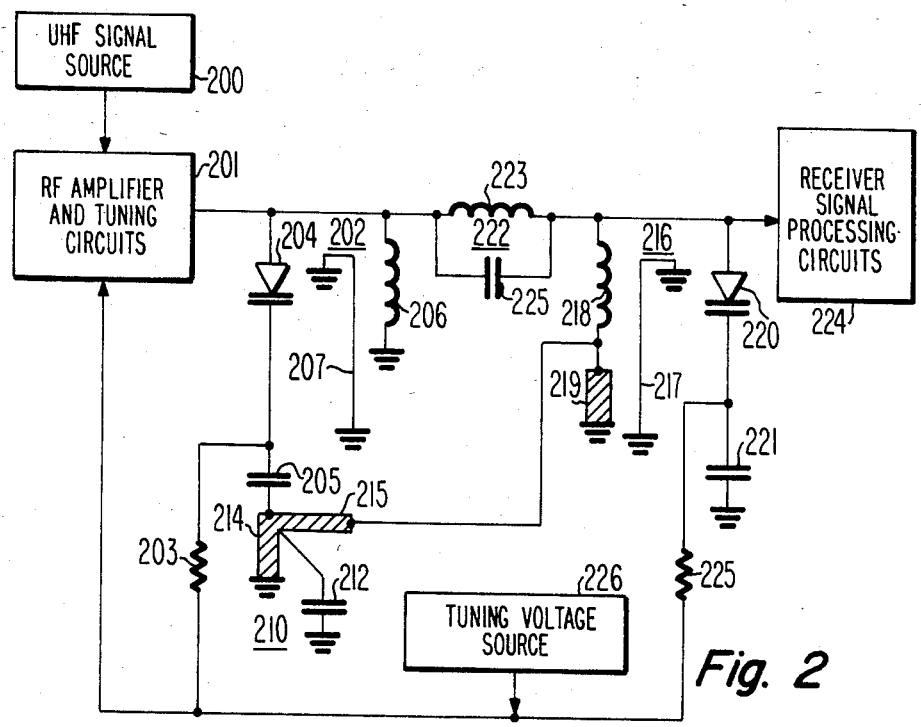

These and other aspects of the invention will be explained with reference to the accompanying drawings in which:

FIG. 1 shows partly in block form and partly in circuit diagram form a schematic of an RF coupling arrangement including a preferred embodiment of the present invention; and FIG. 2 shows partly in block form and partly in circuit diagram form a schematic of an implementation of the coupling arrangement shown in FIG. 1.

In the coupling arrangement of FIG. 1, a radio frequency (RF) source 100 is coupled to a tuned circuit 102 which comprises a tuning capacitance 104 and an inductance 106 which together form a parallel resonant circuit. The resonant circuit is completed by inductance 106 being connected to a common ground 108 and by capacitance 104 being coupled to ground by way of a resonant circuit 110 which comprises a parallel combination of a capacitance 112 and an inductance 114. Current in capacitance 104 will therefore cause a voltage to appear across the circuit impedance of resonant circuit 110. Resonant circuit 102 is tuned to the desired signal frequency supplied by RF source 100. RF source 100 may, for example, include an RF amplifier coupled to a signal source such as a receiving antenna or cable television outlet. While resonant circuit 102 will exhibit maximum response at the desired signal frequency, it will also exhibit some response at other frequencies such as the image frequency. Thus, signals at the desired signal frequency and signals at the image frequency which may be present in the output of RF source 100 will cause corresponding voltages to appear across resonant circuit 110.

A further resonant circuit 116 comprises an inductance 118 and a capacitance 120 which together form a parallel resonant circuit, which is also tuned to the desired signal frequency. Capacitance 120 is directly coupled to ground, whereas inductance 118 is coupled to ground by way of resonant circuit 110, i.e., resonant circuit 110 forms a common impedance in the coupling to ground of both capacitance 104 and inductance 118. The voltage developed across tuned circuit 110 by the current in capacitance 104 will therefore be injected into resonant circuit 116. Resonant circuits 102 and 116 are also mutually coupled by a coupling 122, shown in FIG. 1 in block form. Coupling 122 may be implemented in any convenient and suitable form, an example of which will be described later. As is well known from circuit theory, such couplings can generally be reduced to an equivalent simple coupled circuit with mutual inductance coupling. E.G., see Radio Engineers' Handbook, referred to above, pages 165–170. Signals coupled to inductance 118 by way of coupling 122 will be in addition to signals coupled to inductance 118 by way of resonant circuit 110. There will therefore be two signal components in inductance 118 for each signal frequency present in the output of RF source 100. It has been found possible to cause these components to cancel each other substantially for signals at the image frequency without appreciably affecting signals at the desired signal frequency. This is achieved by appropriately choosing the circuit element values and the sign of coupling 122 so that the image frequency components coupled to inductance 118 are of equal amplitude and opposite sign. Due to the frequency dependent characteristics of the coupling 122, these conditions are not met at the desired signal frequency and significant cancellation does not occur. The coupling arrangement therefore provides a trap for image frequency signals and the output from resonant circuit 116 will exhibit a relatively smaller image signal compared with the output of RF source 100. The output derived from resonant circuit 116 is then applied to receiver signal processing circuits 122 for further processing.

As previously mentioned, it is desirable for the separation between the tuning frequency and the image trap frequency to remain constant with tuning. The operation of resonant circuit 110 in substantially achieving this requirement can be explained as follows. If it first be assumed that capacitance 112 is not connected, it can be shown that the frequency separation between the desired frequency and the trap frequency is proportional to the tuning frequency, with the proportionality being determined by inductance 114. A condition for the frequency separation not to vary when the tuning is varied is that the effective inductance of inductance 114 must vary inversely with the square of frequency over the frequency range of interest. While such a frequency-dependent inductance is fictitious, an equivalent effect is achieved in the present invention by the addition of capacitance 112 to form resonant circuit 110. With suitable values for capacitance 112 and inductance 114, it has been found that resonant circuit 110 can be made to exhibit an effective impedance corresponding to the impedance of a fictitious inductance whose effective value varies inversely with the square of frequency over the frequency range of interest. As has been explained, such a characteristic results in the separation between the image trap frequency and the tuning frequency remaining constant and therefore capable of tracking the actual image frequency as the tuning is varied.

FIG. 2 shows an implementation of the coupling arrangment suitable for use in a television receiver, for example. A UHF signal source 200, which may, for example, comprise an antenna, a cable television outlet, or a video tape recorder, is coupled to an RF amplifier and tuning circuits 201. Typically, the output of RF amplifier 201 will contain signals at the image frequency in addition to the desired signal. This output is applied to a resonant circuit 202 tuned to the desired signal frequency and comprising an inductance 206 and a capacitance 204 which will typically comprise a voltage controlled variable capacitance diode, as here schematically indicated. A grounded loop 207 is provided adjacent inductance 206 to permit trimming adjustments by bending the loop to change its coupling to inductance 206. Capacitance 204 is coupled to ground by way of a DC blocking capacitor 205 and an inductance 214 which typically is of such a small value that it can be implemented by a small section of conductive foil on a printed circuit board. Inductance 214 and a capacitance 212 form a resonant circuit 210 for providing a neutralizing voltage, corresponding to resonant circuit 110 in FIG. 1. Capacitance 212 is typically very small and may usually be provided by stray capacitance associated with a conductor formed on a printed circuit board, so that no other capacitance component is needed.

The voltage developed across resonant circuit 210 is coupled to an inductance 218 by way of a voltage divider which comprises a series inductance 215 and a shunt inductance 219, both of which inductances may typically be formed by conductive strips on a printed circuit board. Thus, only a portion of the neutralizing voltage across resonant circuit 210 is actually coupled to inductance 218. A grounded loop 217 adjacent inductance 218 is provided for trimming adjustment. Inductance 218 forms a resonant circuit 216 at the desired signal frequency with a capacitance 220, shown as a variable capacitance diode, which is grounded by way of a DC blocking capacitor 221. Both capacitances 204 and 220 are supplied with a tuning voltage by way of resistors 203 and 225, respectively from a tuning voltage source 226, which also supplies a tuning voltage to tuning elements in RF amplifier 201.

Resonant circuits 202 and 216 are mutually coupled by a coupling 222 which comprises an inductance 223 and a capacitance 225 coupled in parallel. The output taken from resonant circuit 216 is applied to receiver signal processing circuits 224 for further processing.

As will be understood from the correspondence of the FIG. 1 and FIG. 2 embodiments, the operation of the FIG. 2 embodiment will substantially conform to the description already provided for the FIG. 1 embodiment. It is pointed out that the voltage divider comprising inductance 215 and 219 is employed because the signal amplitude required for image cancellation in inductance 218 is smaller than can be developed across inductance 214 when this is made in conveniently practical dimensions.

The implementation of the invention in accordance with FIGS. 1 and 2 is illustrative. Various modifications to the circuitry for implementing the invention in accordance with the foregoing description will be apparent. For example, other equivalent forms of coupling may be used in place of the illustrative parallel resonant circuit 222. For another example, while tuning voltage source 226 is shown as supplying the same tuning voltage to tuning diodes 204 and 220 and to RF amplifier and tuning circuits 201, different voltages could be supplied to those elements if required. Furthermore, the voltage divider comprising inductance 215 and 219 need not be used if the values of inductance 214 and capacitance 212 are correspondingly changed. In addition, while the operation of the invention has been described with reference to radio frequency receivers, the invention may also be used in other applications where a trap frequency is required to track with tuning to a desired signal frequency.

What is claimed is:
1. In a superheterodyne radio frequency (RF) receiver having an RF signal input port and exhibiting an undesired image frequency response when tuned to a desired signal frequency, an RF coupling arrangement comprising:
   first and second resonant circuit means each comprising respective parallel-connected capacitive and inductive branches, said first resonant circuit means being coupled to said input port for receiving a signal at said input port;

first coupling means for mutually coupling said first and second resonant circuit means;

impedance means coupled in series with said capacitive branch of said first resonant circuit means for providing a neutralizing signal; and second coupling means for coupling at least a portion of said neutralizing signal into said inductive branch of said second resonant circuit means.

2. The RF coupling arrangement recited in claim 1 wherein said first and second resonant circuit means are resonant substantially at said desired signal frequency.

3. The RF coupling arrangement recited in claim 2 wherein said impedance means is selected to exhibit a frequency characteristic such that substantial cancellation occurs over a predetermined range of said image frequency in said inductive branch of said second resonant circuit means between image frequency components of a signal coupled by way of said first coupling means and image frequency components of said portion of said neutralizing signal.

4. The RF coupling arrangement recited in claim 3 wherein cancellation in said inductive branch of said second resonant circuit means of desired signal frequency components of a signal coupled by way of said first coupling means and desired signal frequency components of said portion of said neutralizing signal in substantially less than said cancellation between said image frequency components.

5. The RF coupling arrangement recited in claim 4 wherein the frequency separation between said desired signal frequency and said image frequency is substantially constant.

6. The RF coupling arrangement recited in claim 2 wherein said impedance means comprises a third resonant circuit for providing said neutralizing signal thereacross.

7. The RF coupling arrangement recited in claim 6, wherein said third resonant circuit comprises a parallel connection of an inductance and a capacitance.

8. The RF coupling arrangement recited in claim 7 wherein said second coupling means comprises a connection between said third resonant circuit and said inductive branch of said second resonant circuit means.

9. The RF coupling arrangement recited in claim 8 wherein the resonant frequency of said third resonant circuit is selected for causing over a predetermined range of frequency substantial cancellation in said inductive branch of said second resonant circuit means between image frequency components of a signal coupled by way of said first coupling means and image frequency components of said portion of said neutralizing signal.

10. The RF coupling arrangement recited in claim 9 wherein cancellation in said inductive branch of said second resonant circuit means of desired signal frequency components of a signal coupled by way of said first coupling means and desired signal frequency components of said portion of said neutralizing signal is substantially less than said cancellation at said image frequency.

11. The RF coupling arrangement recited in claim 10 wherein the frequency difference between said image frequency and said desired signal frequency is substantially independent of said desired signal frequency over a predetermined range of frequency.

12. The RF coupling arrangement recited in claim 11 wherein said image frequency is higher than said desired signal frequency.

13. The RF coupling arrangement recited in claim 7 wherein said second coupling means comprises a voltage divider.

14. The RF coupling arrangement recited in claim 13 wherein the resonant frequency of said third resonant circuit is selected for causing over a predetermined range of frequency substantial cancellation in said inductive branch of said second resonant circuit means between image frequency components of a signal coupled by way of said first coupling means and image frequency components of said portion of said neutralizing signal.

15. The RF coupling arrangement recited in claim 14 wherein cancellation in said inductive branch of said second resonant circuit means of desired signal frequency components of a signal coupled by way of said first cuopling means and desired signal frequency components of said portion of said neutralizing signal is substantially less than said cancellation at said image frequency.

16. The RF coupling arrangement recited in claim 15 wherein the frequency difference between said image frequency and said desired signal frequency is substantially independent of said desired signal frequency over a predetermined range of frequency.

17. The RF coupling arrangement recited in claim 16 wherein said image frequency is higher than said desired signal frequency.

18. The RF coupling arrangement recited in claim 2 wherein said impedance means is selected to exhibit a frequency characteristic such that substantial cancellation occurs in said inductive branch of said second resonant circuit means between components of said portion of said neutralizing signal having a frequency substantially equal to a predetermined trap frequency and trap frequency components of a signal coupled by way of said first coupling means.

19. The RF coupling arrangement recited in claim 18 wherein cancellation in said inductive branch of said second resonant circuit means of desired signal frequency components of said portion of said neutralizing signal and desired frequency components of a signal coupled by way of said first coupling means is substantially less than said cancellation between said trap frequency components.

20. The RF coupling arrangement recited in claim 19 wherein the frequency separation between said trap frequency and said desired signal frequency is substantially constant.

21. The RF coupling arrangement recited in claim 20 wherein said trap frequency is substantially equal to said image frequency.

* * * * *